US007645642B2

United States Patent
Bauer et al.

(10) Patent No.: US 7,645,642 B2
(45) Date of Patent: Jan. 12, 2010

(54) METHOD OF JOINING A THERMOPLASTIC MATERIAL TO A THERMOSET MATERIAL, AND THERMOPLASTIC-THERMOSET COMPOSITE

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 466 days.

(21) Appl. No.: 11/348,542

(22) Filed: Feb. 7, 2006

(65) Prior Publication Data
US 2006/0175583 A1 Aug. 10, 2006

(30) Foreign Application Priority Data
Feb. 7, 2005 (DE) .................... 10 2005 005 750

(51) Int. Cl.
*H01L 21/00* (2006.01)
*H01B 1/24* (2006.01)
*H01B 1/06* (2006.01)
*C08F 290/14* (2006.01)

(52) U.S. Cl. .................. 438/126; 438/106; 438/125; 257/E21.502; 257/E23.116; 252/511; 525/50

(58) Field of Classification Search ........... 438/106, 438/126, 125; 252/511; 525/50; 257/E21.502, 257/E23.116
See application file for complete search history.

(56) References Cited

U.S. PATENT DOCUMENTS

| 6,214,446 | B1* | 4/2001 | Funada et al. ............. 428/212 |
| 6,440,777 | B2* | 8/2002 | Cobbley et al. ........... 438/118 |
| 6,762,219 | B2 | 7/2004 | Greiner et al. |
| 6,790,882 | B2* | 9/2004 | Greiner et al. ............. 523/223 |
| 6,847,125 | B2* | 1/2005 | Tanaka et al. ............. 257/787 |
| 6,878,765 | B2 | 4/2005 | Greiner et al. |
| 7,135,358 | B2* | 11/2006 | Sugino et al. ............. 438/126 |
| 2004/0262782 | A1* | 12/2004 | Ellis et al. ................. 257/787 |
| 2005/0191787 | A1* | 9/2005 | Bolken et al. ............. 438/106 |

FOREIGN PATENT DOCUMENTS

EP 0685515 A1 5/1995
WO WO 2004/076370 A1 9/2004

* cited by examiner

*Primary Examiner*—Alexander G Ghyka
*Assistant Examiner*—Seahvosh J Nikmanesh
(74) *Attorney, Agent, or Firm*—Edell, Shapiro & Finnan, LLC

(57) ABSTRACT

A method of joining a thermoplastic material to a thermoset material, and a resultant thermoplastic-thermoset composite formed from such method are provided. At least one of the thermoplastic material and the thermoset material includes particles that melt when the thermoplastic material and the thermoset material are heated during the joining operation. The particles further produce a solid bond between the materials after the particles have solidified in the course of cooling after the joining operation.

17 Claims, 1 Drawing Sheet

METHOD OF JOINING A THERMOPLASTIC MATERIAL TO A THERMOSET MATERIAL, AND THERMOPLASTIC-THERMOSET COMPOSITE

CROSS REFERENCE TO RELATED APPLICATIONS

This application claims priority under 35 USC §119 to German Application No. DE 10 2005 005 750.0, filed on Feb. 7, 2005, and titled "Method of Joining a Thermoplastic Material to a Thermoset Material, and Thermoplastic-Thermoset Composite," the entire contents of which are hereby incorporated by reference.

FIELD OF THE INVENTION

The present invention relates to a method of joining a thermoplastic material to a thermoset material, and to a thermoplastic-thermoset composite produced by such method.

BACKGROUND

It is desirable to use thermoplastic compounds such as polyethylene terephthalate or polyphenylene sulfide for injection or casting onto thermoset components, especially semiconductor components, which have been provided with a housing made from a thermoset material. This is the case, for example, when a semiconductor component is to be provided with a mount made from a thermoplastic material, in order to make the component installable.

In this context, or generally when joining or combining thermoset materials to or with thermoplastic materials, the problem exists of providing effective adhesion between the two different materials. One possibility is to deform the surface of the thermoset in order to create greater adhesion between a thermoset part and a thermoplastic part which is to be applied to it. This is not possible, however, for housings of semiconductor components.

It is also not possible to employ, for example, the option of two-component injection molding, a method by means of which thermoset/thermoplastic composites can be created, since this involves the subsequent attachment of components to the semiconductor component when its processing is already complete.

Thus, when a thermoplastic material is applied subsequently to a thermoset material by conventional methods, the problem generally exists that the adhesion which develops by fusion of the components at their interfaces (interdiffusion of the molecule chains) on contact of the heated thermoplastic material or thermoplastic melt on the cold thermoset material is inadequate and that, as a result, delamination often occurs.

SUMMARY OF THE INVENTION

The present invention provides a method of joining a thermoplastic material to a thermoset material, and also a resultant thermoplastic-thermoset composite, which facilitates improved adhesion between the two materials and subsequent parting of the two materials is avoided.

In accordance with the present invention, a method of joining a thermoplastic material to a thermoset material comprises introducing particles into the thermoset material and/or into the thermoplastic material, where the particles melt when the thermoplastic material and the thermoset material are heated during the joining operation and solidify in the course of cooling after the joining operation, so as to produce a solid chemical bond between the thermoplastic material and the thermoset material.

In accordance with another embodiment of the invention, a thermoplastic-thermoset composite is provided including a thermoplastic material and a thermoset material, where at least one of the thermoplastic material and the thermoset material comprises particles whose melting when the thermoplastic material and the thermoset material are heated during the joining operation produces a solid bond between the materials after the particles have solidified in the course of cooling after the joining operation. The particles provided in the thermoplastic material and/or thermoset material create a stable, permanent bond between the thermoplastic and the thermoset.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
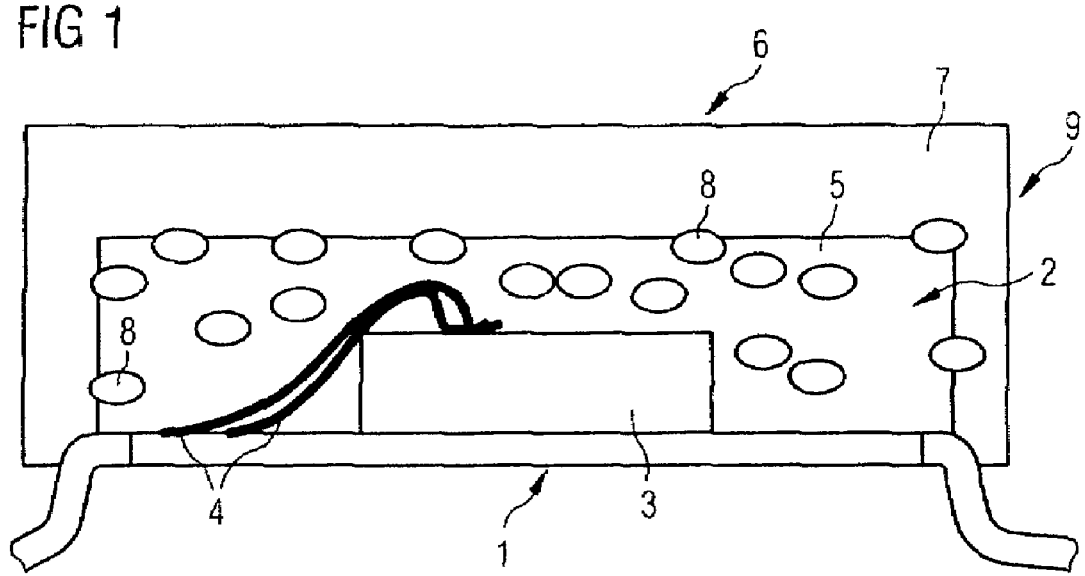
FIG. 1 depicts a diagrammatic cross-section through a semiconductor component with thermoplastic encapsulation in accordance with an exemplary embodiment of the present invention.

A method of joining a thermoplastic material to a thermoset material is provided in accordance with the present invention, where particles are introduced into the thermoset material and/or into the thermoplastic material. The particles melt when the thermoplastic material and the thermoset material are heated during the joining operation and solidify in the course of cooling after the joining operation, so as to produce a solid chemical bond between the thermoplastic material and the thermoset material.

A thermoplastic-thermoset composite is also provided in accordance with the present invention, where the composite includes a thermoplastic material and a thermoset material. At least one of the thermoplastic material and the thermoset material includes particles whose melting when the thermoplastic material and the thermoset material are heated during the joining operation produces a solid bond between the materials after the particles have solidified in the course of cooling after the joining operation. The particles provided in the thermoplastic material and/or thermoset material create a stable, permanent bond between the thermoplastic and the thermoset.

Using the method of the invention, it is possible to achieve a distinct improvement in adhesion between thermosets and thermoplastics. For example, when encapsulating components by injection molding with the thermoplastics comprising the particles, melting of the particles and the attendant free reactive valences of the melted particles produce a high level of bonding strength between the thermoset and the thermoplastic. The thermoplastic with admixed particles also provide further advantages, such as: high mechanical strength, increased insulation strength and breakdown strength, outstanding chemical resistance (particularly toward acids, bases, and water), increased thermal conductivity, good flow properties and processing properties, and excellent abrasion resistance.

The same result is also achieved when the particles are provided in the thermoset material. For example, the encapsulation of a semiconductor housing with the thermoplastic causes the particles to melt in the near-surface region—the processing temperature of the thermoplastic is above 270° C.—and they react with the reactive groups of the thermoplastic, thus producing a very high level of bond strength.

It is also possible for the particles to be provided both in the thermoplastic material and in the thermoset material.

Preferably, the meltable particles include glass particles. More preferably, the glass particles include sulfo or sulfophosphate glasses, which are added in an amount between 15% and 80% by weight to the thermoplastic material and/or to the thermoset material. For example, a low-melting sulfophosphate glass (i.e. a sulfophosphate glass having a low melting temperature), in particular a melting temperature below 300° C., is utilized for the glass particles to be added to the thermoplastic and/or to the thermoset material.

In an exemplary embodiment of the invention, the joining operation comprises an encapsulating operation at temperatures above 260° C., the temperature of 260° C. also corresponding to the maximum soldering temperature peak for power semiconductor housings.

In another preferred embodiment of the invention, the encapsulating operation includes encapsulation of a semiconductor component, which is potted in, or encapsulated by, a thermoset material, with a thermoplastic material.

Preferred thermoplastic materials for use in the present invention include one or more of the following materials: liquid-crystalline polymer (LCP), polyethylene terephthalate (PET), polyether sulfone (PES), polyphenylene sulfide (PPS), polyether ether ketone (PEEK) and polysulfone (PSU).

The thermoplastic material is preferably a high-performance thermoplastic, in particular a high-temperature-stability thermoplastic.

Preferred thermoset materials for use in the invention include resins, such as epoxy resin or silicone resin.

In a further embodiment of the invention, the particles are incorporated as a filler additive into thermoset compression molding compounds. This optimizes the physical properties and processing properties, and allows the profile of properties of the compression molding compound or resin precursor to be custom-tailored.

According to one preferred embodiment of the invention, the thermoset material forms a housing of a semiconductor component and the thermoplastic material forms a housing mount on the housing of the semiconductor component, the housing and the housing mount preferably being firmly joined to one another by the glass particles, thereby making the semiconductor component installable. The particles can be introduced into the thermoset material of the semiconductor housing. Alternatively, or in addition to being incorporated into the thermoset material of the housing, the particles can be incorporated into the thermoplastic material of a housing mount.

Exemplary embodiments of semiconductor components including particles incorporated into a thermoset material and/or a thermoplastic material of the components are described below with reference to FIGS. 1 and 2.

Figure 2:
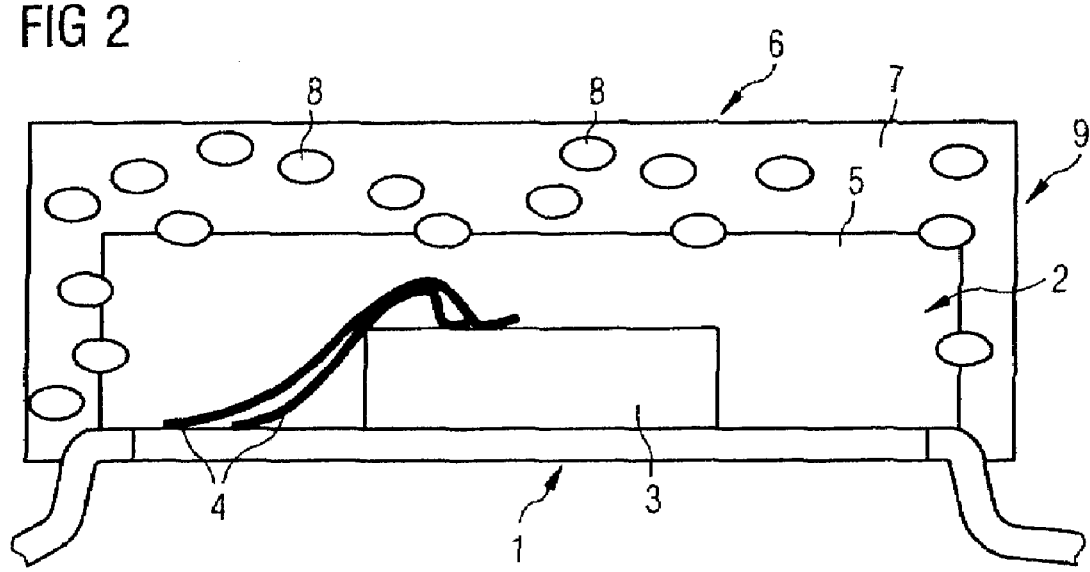
FIG. 2 depicts a diagrammatic cross-section through a semiconductor component with thermoplastic encapsulation in accordance with another exemplary embodiment of the present invention.

FIGS. 1 and 2 both show diagrammatic cross-sectional views through an encapsulated semiconductor component 1. The semiconductor component 1 in each Figure includes a chip 3 which can be connected electrically via leads 4. The chip 3 is surrounded by a housing 5 made from a thermoset material 2. Bordering the thermoset material 2 of the housing 5 is a surround 6 or encapsulation, which is made of a thermoplastic material 7.

Referring to FIG. 2, embedded in uniform distribution in the thermoplastic material 7 are particles 8. In this embodiment, the particles 8 include sulfo glass particles in an amount of 50% by weight. During the operation of encapsulating the semiconductor component 1, the particles 8 melt completely and, after they have then cooled again and solidified, form a solid chemical bond with the thermoset material 2 of the housing 5. When the semiconductor component 1 is encapsulated by injection molding with this thermoplastic blend, the glass component is melted and the attendant free, reactive valences of the melted glass particles produce a high level of bond strength to the encapsulated component.

Moreover, the surround 6 made of this thermoplastic blend exhibits a high mechanical strength, increased insulation strength and breakdown strength, outstanding chemical resistance, increased thermal conductivity, good flow properties and processing properties, and excellent abrasion resistance. Hence, a stable thermoplastic-thermoset composite 9 is provided having properties which are outstanding.

In contrast to the embodiment of FIG. 2, the housing 5 in the embodiment of FIG. 1 (which is formed of a thermoset material 2) includes particles 8 distributed uniformly in it. The particles 8 are particles of sulfo glass and have been added to the thermoset material 2 in an amount of approximately 50% by weight. An external surround 6 or encapsulation of the semiconductor component 1 is injected onto the housing 5 and, as a result of the particles 8 present in the thermoset material 2, forms a solid bond with the housing 5.

The surround 6 of FIG. 1 is made of a thermoplastic material 7 to which no particles 8 have been added. As a result of the encapsulation of the housing 5 of the semiconductor component 1 with the thermoplastic material 7, the sulfo glass particles melt in the near-surface region, owing to the introduction of heat provided by the processing temperature of the thermoplastic material 7 at a temperature above 270° C., and they react with the reactive groups of the thermo-plastic material, thus producing the very high bond strength.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method of forming a structure including a thermoplastic material joined with a thermoset material, the method comprising:

introducing particles into at least one of the thermoset material and the thermoplastic material, wherein the particles comprise at least one of sulfo glass particles and sulfophosphate glass particles;

joining and heating the thermoset material and the thermoplastic material, wherein the particles melt during the heating; and cooling the thermoplastic material and the thermoset material after the joining step, wherein the particles are solidified during the cooling so as to produce a solid chemical bond between the thermoplastic material and the thermoset material.

2. The method of claim 1, wherein the joining step comprises encapsulating the thermoset material with the thermoplastic material at a heating temperature above 260°C.

3. The method of claim 2, wherein the encapsulation includes encapsulation of a semiconductor component that is cast with the thermoset material, the semiconductor component being encapsulated by the thermoplastic material.

4. The method of claim 1, wherein the thermoplastic material is selected from the group consisting of liquid-crystalline polymer (LCP), polyethylene terephthalate (PET), polyether sulfone (PES), polyphenylene sulfide (PPS), polyether ether ketone (PEEK) and polysulfone (PSU).

5. The method of claim 1, wherein the thermoplastic material comprises a high-performance thermoplastic with high temperature stability.

6. The method of claim 1, wherein the thermoset material comprises a synthetic resin.

7. The method of claim 1, wherein the thermoset material comprises one of an epoxy resin and a silicone resin.

8. The method of claim 1, wherein the introduction of particles into at least one of the thermoset material and the thermoplastic material the particles comprises incorporating the particles as filler additives into thermoset compression molding compounds.

9. The method of claim 1, wherein the particles are introduced into the thermoset material, and the thermoset material is formed as a semiconductor housing.

10. The method of claim 1, wherein the particles are introduced into the thermoplastic material, and the thermoplastic material is formed as a housing mount.

11. The method of claim 1, wherein the thermoset material is formed as a semiconductor housing, the thermoplastic material is formed as a housing mount, and the semiconductor housing and the housing mount are joined to each another.

12. A thermoplastic-thermoset composite comprising a thermoplastic material joined with a thermoset material via a heating process, wherein at least one of the thermoplastic material and the thermoset material includes particles that melt during the heating process so as to produce a solid bond between the thermoset and thermoplastic materials upon cooling and solidification of the particles, and the particles comprise at least one of sulfo glass particles and sulfophosphate glass particles.

13. The thermoplastic-thermoset composite of claim 12, wherein the thermoplastic material is selected from the group consisting of a liquid-crystalline polymer (LCP), polyethylene terephthalate (PET), polyether sulfone (PES), polyphenylene sulfide (PPS), polyether ether ketone (PEEK) and polysulfone (PSU).

14. The thermoplastic-thermoset composite of claim 12, wherein the thermoplastic material comprises a high-performance thermoplastic with high temperature stability.

15. The thermoplastic-thermoset composite of claim 12, wherein the thermoset material comprises a synthetic resin.

16. The thermoplastic-thermoset composite of claim 12, wherein the thermoset material comprises one of an epoxy resin and a silicone resin.

17. The thermoplastic-thermoset composite of claim 12, wherein the thermoset material is formed as a housing of a semiconductor component, and the thermoplastic material is formed as a housing mount that mounts on the housing of the semiconductor component.

* * * * *